United States Patent
Kodama et al.

(10) Patent No.: US 11,501,909 B2
(45) Date of Patent: Nov. 15, 2022

(54) INDUCTOR BUILT-IN SUBSTRATE AND METHOD FOR MANUFACTURING THE SAME

(71) Applicant: IBIDEN CO., LTD., Ogaki (JP)

(72) Inventors: Hiroaki Kodama, Ogaki (JP); Kazuro Nishiwaki, Ogaki (JP); Kazuhiko Kuranobu, Ogaki (JP); Hiroaki Uno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 282 days.

(21) Appl. No.: 16/855,108

(22) Filed: Apr. 22, 2020

(65) Prior Publication Data
US 2020/0335259 A1    Oct. 22, 2020

(30) Foreign Application Priority Data

Apr. 22, 2019  (JP) .............................. JP2019-081006

(51) Int. Cl.
| | |
|---|---|
| H01L 27/28 | (2006.01) |
| H01F 27/28 | (2006.01) |
| H01L 23/498 | (2006.01) |
| H01L 23/552 | (2006.01) |
| H01F 41/04 | (2006.01) |
| H01L 21/48 | (2006.01) |

(52) U.S. Cl.
CPC ..... *H01F 27/2804* (2013.01); *H01F 27/2885* (2013.01); *H01F 41/041* (2013.01); *H01L 21/4857* (2013.01); *H01L 23/49816* (2013.01); *H01L 23/49822* (2013.01); *H01L 23/49838* (2013.01); *H01L 23/552* (2013.01); *H01F 2027/2809* (2013.01)

(58) Field of Classification Search
None
See application file for complete search history.

(56) References Cited

U.S. PATENT DOCUMENTS 10,818,428 B1 * 10/2020 Kodama ................. H01F 27/24

FOREIGN PATENT DOCUMENTS

JP    2016-197624 A1    11/2016

* cited by examiner

*Primary Examiner* — Long Pham
(74) *Attorney, Agent, or Firm* — Oblon, McClelland, Maier & Neustadt, L.L.P.

(57) ABSTRACT

An inductor built-in substrate includes a core substrate having openings, a magnetic resin filled in the openings and having through holes, and through-hole conductors formed in the through holes respectively such that each of the through-hole conductors includes a metal film. The magnetic resin is formed such that each of the through holes has an angle part having an obtuse angle formed by an upper surface of the magnetic resin and a side wall of a respective one of the through holes.

20 Claims, 6 Drawing Sheets

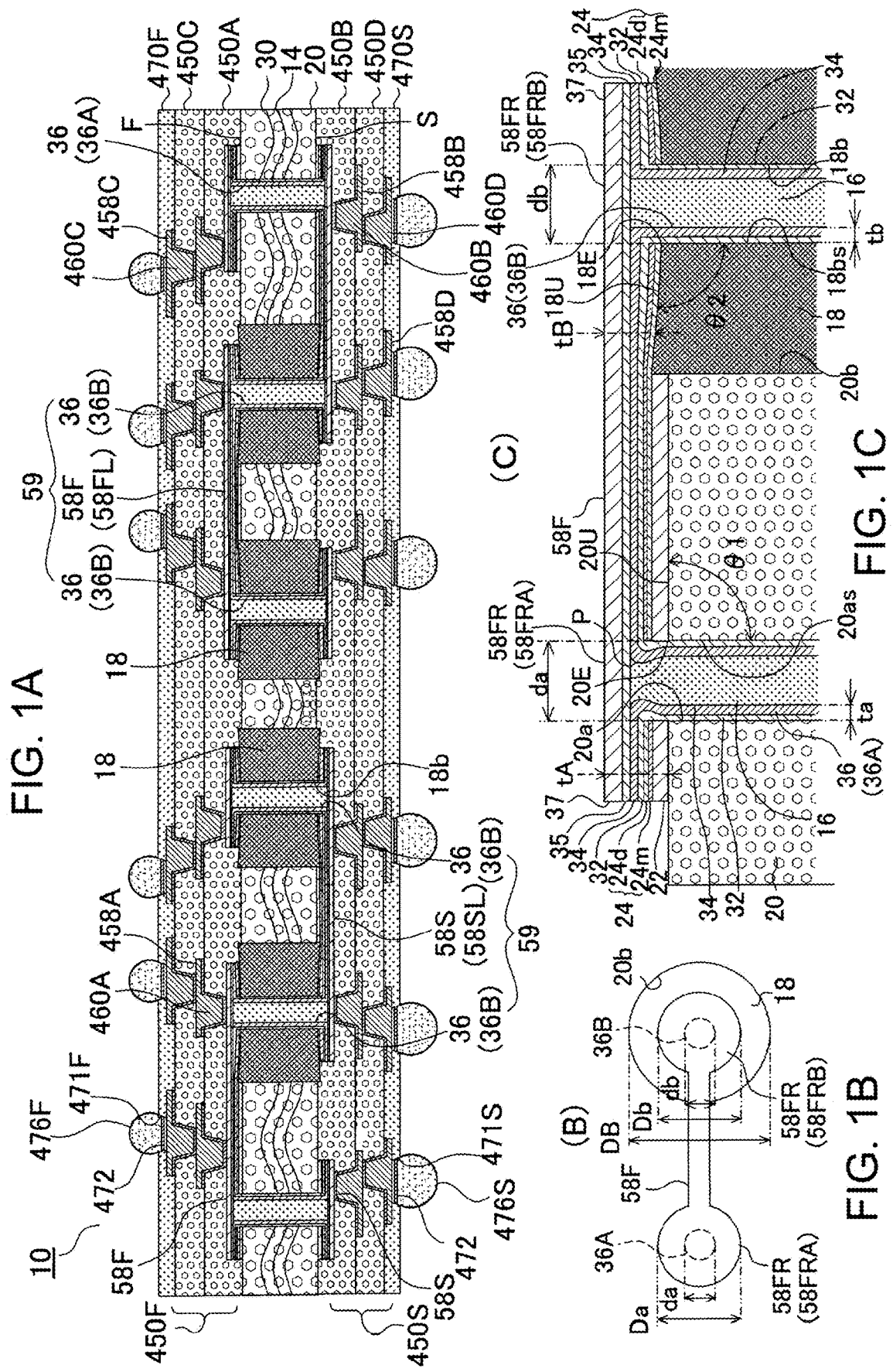

ent application is based upon and claims the
INDUCTOR BUILT-IN SUBSTRATE AND METHOD FOR MANUFACTURING THE SAME

CROSS-REFERENCE TO RELATED APPLICATIONS

The present application is based upon and claims the benefit of priority to Japanese Patent Application No. 2019-081006, filed Apr. 22, 2019, the entire contents of which are incorporated herein by reference.

BACKGROUND OF THE INVENTION

Field of the Invention

The present invention relates to an inductor built-in substrate that has an inductor built therein.

Description of Background Art

Japanese Patent Application Laid-Open Publication No. 2016-197624 describes a method for manufacturing an inductor component built in a wiring substrate. The entire contents of this publication are incorporated herein by reference.

SUMMARY OF THE INVENTION

According to one aspect of the present invention, an inductor built-in substrate includes a core substrate having openings, a magnetic resin filled in the openings and having through holes, and through-hole conductors formed in the through holes respectively such that each of the through-hole conductors includes a metal film. The magnetic resin is formed such that each of the through holes has an angle part having an obtuse angle formed by an upper surface of the magnetic resin and a side wall of a respective one of the through holes.

According to another aspect of the present invention, a method for manufacturing an inductor built-in substrate includes preparing a core substrate including a resin substrate and a metal foil laminated on the resin substrate, forming openings in the core substrate, filling a magnetic resin in the openings formed in the core substrate, forming through holes in the magnetic resin, and forming a plating film on the core substrate, on a surface of the magnetic resin, and in the through holes. The filling of the magnetic resin includes polishing an upper surface of the magnetic resin in each of the openings such that a central portion of the upper surface of the magnetic resin in each of the openings is recessed relative to a peripheral portion of the upper surface of the magnetic resin in each of the openings.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a cross-sectional view of an inductor built-in substrate according to an embodiment of the present invention;

FIG. 1B is a plan view of through-hole lands;

FIG. 1C is an enlarged view of a core substrate of the inductor built-in substrate;

DETAILED DESCRIPTION OF THE EMBODIMENTS

Figure 2A:
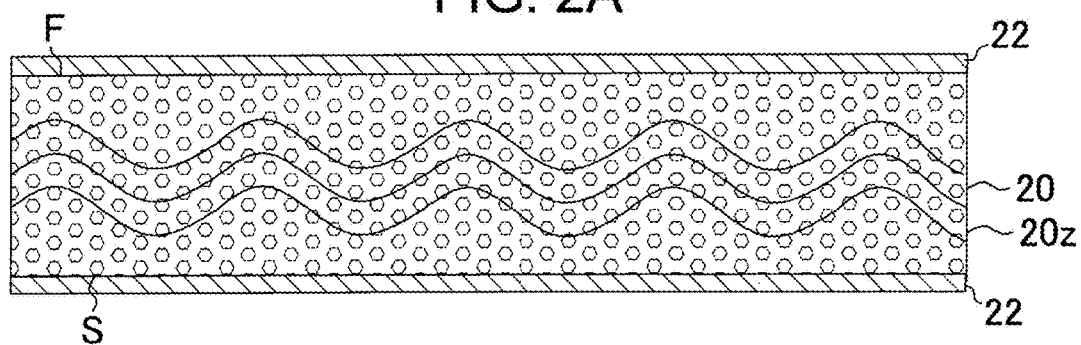
FIGS. 2A-2D are process diagrams illustrating a method for manufacturing an inductor built-in substrate according to an embodiment of the present invention.

Embodiments will now be described with reference to the accompanying drawings, wherein like reference numerals designate corresponding or identical elements throughout the various drawings.

FIG. 1A illustrates a cross-sectional view of an inductor built-in substrate 10 of an embodiment that has an inductor built therein. The inductor built-in substrate 10 has a core substrate 30 that is formed to include: an insulating base material 20 that has a first surface (F) and a second surface (S) on an opposite side with respect to the first surface (F); a first conductor layer (conductor circuit) (58F) on the first surface (F) of the insulating base material; a second conductor layer (58S) on the second surface (S) of the insulating base material; and through-hole conductors 36 that connect the first conductor layer (58F) and the second conductor layer (58S) to each other. The core substrate 30 has a first surface (F) and a second surface (S) on an opposite side with respect to the first surface (F). The first surface (F) of the core substrate 30 and the first surface (F) of the insulating base material 20 are the same surface, and the second surface (S) of the core substrate 30 and the second surface (5) of the insulating base material 20 are the same surface. The insulating base material 20 is formed of a resin such as an epoxy resin and a core material 14 such as a glass cloth for reinforcement. The insulating base material 20 may further contain inorganic particles such as silica particles.

The inductor built-in substrate 10 further has an upper side build-up layer (450F) formed on the first surface (F) of the core substrate 30. The upper side build-up layer (450F) includes: an insulating layer (450A) formed on the first surface (F) of the core substrate 30; a conductor layer (458A) formed on the insulating layer (450A); and via conductors (460A) penetrating the insulating layer (450A) and connecting the first conductor layer (58F) and the conductor layer (458A) to each other. The upper side build-up layer (450F) further includes: an insulating layer (450C) formed on the insulating layer (450A) and the conductor layer (458A); a conductor layer (458C) formed on the insulating layer (450C); and via conductors (460C) penetrating the insulating layer (450C) and connecting the conductor layer (458A) and the via conductors (460A) to the conductor layer (458C).

The inductor built-in substrate 10 further has a lower side build-up layer (450S) formed on the second surface (S) of the core substrate 30. The lower side build-up layer (450S) includes: an insulating layer (450B) formed on the second surface (S) of the core substrate 30; a conductor layer (458B) formed on the insulating layer (450B); and via conductors (460B) penetrating the insulating layer (450B) and connecting the second conductor layer (58S) and the conductor layer (458B) to each other. The lower side build-up layer (450S) further includes: an insulating layer (450D) formed on the insulating layer (450B) and the conductor layer (458B); a conductor layer (458D) formed on the insulating layer (450D); and via conductors (460D) penetrating the insulating layer (450D) and connecting the conductor layer (458B) and the via conductors (460B) to the conductor layer (458D).

The inductor built-in substrate of the embodiment further includes a solder resist layer (470F) having openings (471F) formed on the upper side build-up layer (450F) and a solder resist layer (470S) having openings (471S) formed on the lower side build-up layer (450S).

Upper surfaces of the conductor layers (458C, 458D) or the via conductors (460C, 460D) exposed from the openings (471F, 471S) of the solder resist layers (470F, 470S) function as pads. A protective film 472 formed of Ni/Au, Ni/Pd/Au, Pd/Au, or OSP is formed on each of the pads. Solder bumps (476F, 476S) are respectively formed on the protective films. An IC chip (not illustrated in the drawings) is mounted on the inductor built-in substrate 10 via the solder bumps (476F) formed on the upper side build-up layer (450F). The inductor built-in substrate 10 is mounted on a motherboard via the solder bumps (476S) that are formed on the lower side build-up layer (450S).

FIG. 1C illustrates an enlarged view of a portion of the core substrate 30 in FIG. 1A. In the core substrate 30, the through-hole conductors 36 connecting the first conductor layer (58F) and the second conductor layer (58S) to each other include first through-hole conductors (36A) that are respectively formed in first through holes (20a) penetrating the core substrate 30 and second through-hole conductors (36B) that are respectively formed in second through holes (18b) of a magnetic resin 18 filled in openings (20b) of the core substrate 30. A diameter (da) of each of the first through holes (20a) and a diameter (db) of each of the second through holes (18b) are substantially equal to each other. A resin filler 16 is filled inside the first through-hole conductors (36A) and the second through-hole conductors (36B), and through-hole lands (58FR) are formed of cover plating. The through-hole lands (58FR) include first through-hole lands (58FRA) respectively formed on the first through-hole conductors (36A) and second through-hole lands (58FRB) respectively formed on the second through-hole conductors (36B).

An angle (θ1) of an angle part (20E) of each of the first through holes (20a) (angle part (20E) being formed by an upper surface (20U) of the insulating base material 20 and a side wall (20as) of the each of the first through holes (20a)) is substantially a right angle. The angle (θ1) is a value on a plan passing through a central axis of the each of the first through holes (20a). An angle (θ2) of an angle part (18E) of each of the second through holes (18b) (the angle part (18E) being formed by an upper surface (18U) of the magnetic resin 18 and a side wall (18bs) of the each of the second through holes (18b)) is an obtuse angle (91-100 degree). The angle (θ2) is a value on a plan passing through a central axis of the each of the second through holes (18b). The angle (θ2) of the angle part (18E) of each of the second through holes (18b) is an obtuse angle. A stress applied from the angle part (18E) to the conductor layers (the shield layer 24, the second electroless plating film 32, and the second electrolytic plating film 34) provided at the angle part (18E) of each of the second through holes (18b) is relaxed. A crack is unlikely to occur in the conductor layers at the angle part (18E), and reliability of the inductor built-in substrate is high.

When the angle (θ1) of the angle part of each of the first through holes (20a) is substantially a right angle, an inflow amount of a plating solution is reduced, and a protruding part (P) protruding toward an inner side of each of the first through holes (20a) is likely to be formed at an upper end (and at a lower end which is not illustrated in the drawings) of each of the first through-hole conductors (36A). On the other hand, when the angle (θ2) of the angle part of each of the second through holes (18b) is an obtuse angle, an inflow amount of a plating solution is large, and thus, a protruding part is unlikely to be formed at an upper end (and at a lower end which is not illustrated in the drawings) of each of the second through-hole conductors (36B) formed in the second through holes (18b). In the first through holes (20a) provided in the insulating base material 20, residues generated when the first through holes (20a) are formed are removed by a chemical treatment. Therefore, even when the protruding parts (P) exist, the resin filler can be easily filled inside the first through-hole conductors (36A) without occurrence of voids. In the second through holes (18b) provided in the magnetic resin 18, residues generated when the second through holes (18b) are formed cannot be removed using a chemical solution. That is, when a chemical solution is used, the magnetic filler (iron oxide filler) in the magnetic resin changes in nature. Here, since a protruding part is not formed at an upper end (and at a lower end which is not illustrated in the drawings) of each of the second through-hole conductors (36B), the resin filler can be filled in the second through-hole conductors (36B), and voids are unlikely to occur in the resin filler.

FIG. 1B is a plan view of a first through-hole land (58FRA) formed on a first through-hole conductor (36A) and a second through-hole land (58FRB) formed on a second through-hole conductor (36B). The first through-hole land (58FRA) is concentrically formed with the first through-hole conductor (36A), and the second through-hole land (58FRB) is concentrically formed with the second through-hole conductor (36B). A diameter (Da) of the first through-hole land (58FRA) and a diameter (Db) of the second through-hole land (58FRB) are substantially equal to each other. The first through-hole land (58FRA) and the second through-hole land (58FRB) are connected to each other by the first conductor layer (circuit pattern) (58F). The diameter (Db) of the second through-hole land (58FRB) is smaller than a diameter (DB) of each of the openings (20b) in which the magnetic resin 18 is filled. That is, the second through-hole land (58FRB) does not spread from the magnetic resin 18 to the insulating base material 20.

The magnetic resin 18 contains an iron oxide filler (magnetic particles) and a resin such as an epoxy resin. Examples of the magnetic particles include iron oxide fillers such as iron (III) oxide particles. A content of the iron oxide filler in the magnetic resin is preferably 60-90% by weight. From a point of view that the content of the iron oxide filler can be increased and magnetic permeability and heat conductivity can be increased, particle sizes of the iron oxide filler are desirably non-uniform.

As illustrated in FIG. IC, a first through-hole conductor (36A) formed in a first through hole (20a) penetrating the core substrate 30 is in contact with the first through hole (20a). The first through-hole conductor (36A) includes a second electroless plating film 32 on the first through hole (20a), and a second electrolytic plating film 34 on the second electroless plating film 32. A second through-hole conductor (36B) formed in a second through hole (18b) penetrating the magnetic resin 18 is in contact with the second through hole (18b). The second through-hole conductor (36B) includes a second electroless plating film 32 on the second through hole (18b), and a second electrolytic plating film 34 on the second electroless plating film 32. A thickness (ta) of the second electroless plating film 32 and the second electrolytic plating film 34 that form the first through-hole conductor (36A) is larger than a thickness (tb) of the second electroless plating film 32 and the second electrolytic plating film 34 that form the second through-hole hole conductor (36B). When the thickness (ta) of the first through-hole conductor (36A) formed in the first through hole (20a) of the insulating base material 20 having a low heat conductivity is larger than the thickness (tb) of the second through-hole conductor (36B) formed in the second through hole (18b) of the magnetic resin 18 having a high heat conductivity, a balance in heat dissipation between the first through-hole conductor (36A) and the second through-hole conductor (36B) is adjusted.

The first through-hole lands (58FRA) and the first conductor layer (58F) on the insulating base material 20 are each formed of the copper foil 22 as a lowermost layer, the first electroless plating film (24m) on the copper foil 22, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The second through-hole lands (58FRB) and the first conductor layer (58F) on the magnetic resin 18 are each formed of the first electroless plating film (24m) as a lowermost layer, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The first electroless plating film (24m) and the first electrolytic plating film (24d) form a shield layer 24. A thickness (tA) of the first through-hole lands (58FRA) and the first conductor layer (58F) on the insulating base material 20 is larger than a thickness (tB) of the second through-hole lands (58FRB) and the first conductor layer (58F) on the magnetic resin 18 by a thickness of the copper foil 22. When the thickness (tA) of the first through-hole lands (58FRA) formed on the insulating base material 20 having a low heat conductivity is larger than the thickness (tB) of the second through-hole lands (58FRB) formed on the magnetic resin 18 having a high heat conductivity by the thickness of the copper foil 22 having a high heat conductivity, a balance in heat dissipation between the first through-hole conductors (36A) and the second through-hole conductors (36B) is adjusted.

In the core substrate 30 of the embodiment, the first conductor layer (58F) (connection pattern (58FL)) and the second conductor layer (58S) (connection pattern (58SL)) which are connected to each other via the second through-hole conductors (36B) formed in the magnetic resin 18 illustrated in FIG. 1A are formed in a helical shape (a spiral shape along an axis in a direction parallel to the front and back surfaces of the core substrate), and together with the second through-hole conductors (36B) form an inductor 59.

In the inductor built-in substrate 10 of the embodiment, the first conductor layer (58F) and the second conductor layer (58S) are formed on the surfaces of the core substrate 30, and the second through-hole conductors (36B) connecting the first conductor layer (58F) and the second conductor layer (58S) to each other are directly formed in the second through holes (18b) penetrating the magnetic resin 18. Therefore, a ratio of a magnetic material in the inductor built-in substrate 10 is increased and an inductance can be increased.

Method for Manufacturing Inductor Built-In Substrate

A method for manufacturing an inductor built-in substrate according to an embodiment of the present invention is illustrated in FIGS. 2A-5C.

Figure 2B:
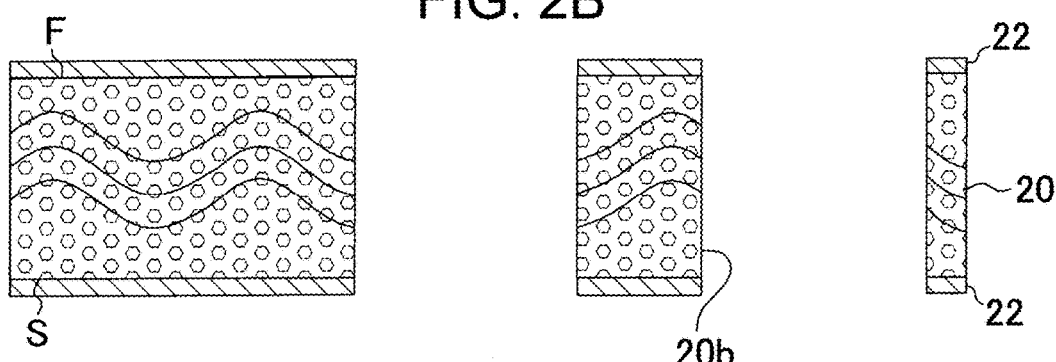
Figure 2C:
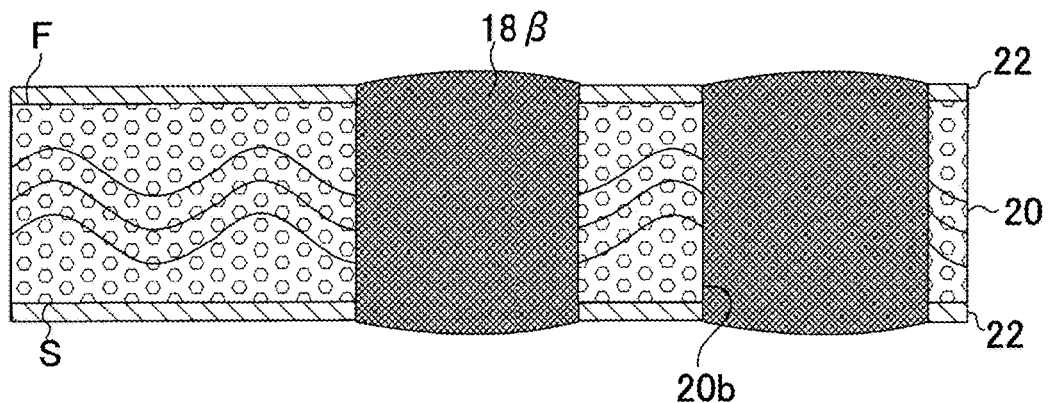
Figure 2D:
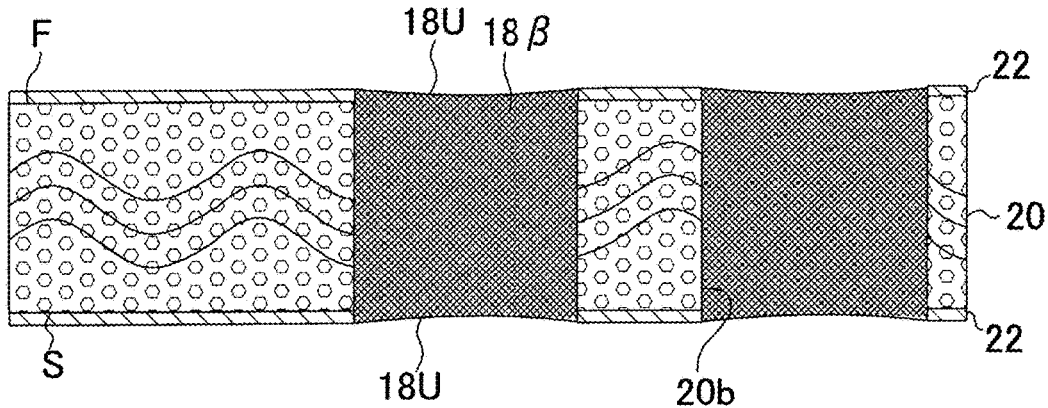

A substrate (20z) is prepared which is formed of a copper-clad laminated plate which is formed by laminating a copper foil 22 on both sides of the insulating base material 20 (FIG. 2A). The openings (20b) for filling the magnetic resin therein are formed in the insulating base material 20 (FIG. 2B). A resin paste containing an iron oxide filler (magnetic particles) in an amount of 60-90% by weight and an epoxy resin is vacuum-printed in the openings (20b). The resin paste is temporarily cured (semi-cured) at a temperature at which a viscosity of the resin paste is 2 or less times that at a normal temperature, and a temporarily cured magnetic resin (13β) is formed (FIG. 2C). An upper surface (18U) of the temporarily cured magnetic resin (18β) is polished, and is formed in a mortar-like shape having a concave central portion (FIG. 2D). The polishing is performed using a polishing material that allows the magnetic resin to be more easily polished than the copper foil.

Figure 3A:
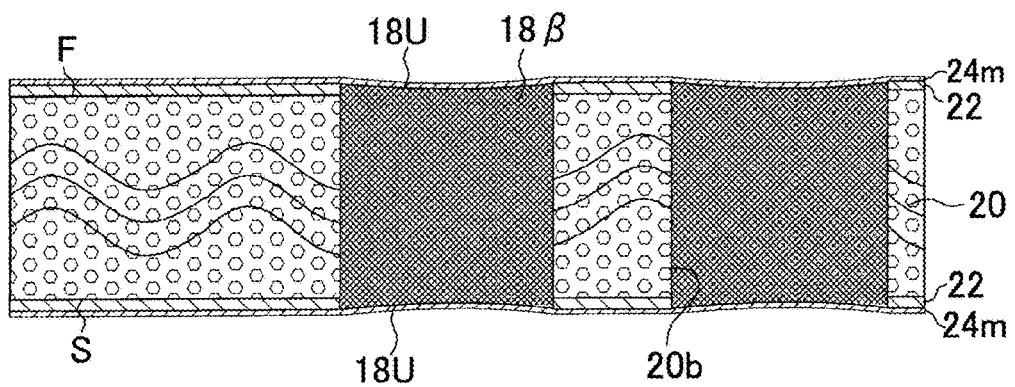
FIGS. 3A-3D are process diagrams illustrating the method for manufacturing an inductor built-in substrate according to the embodiment.
Figure 3B:
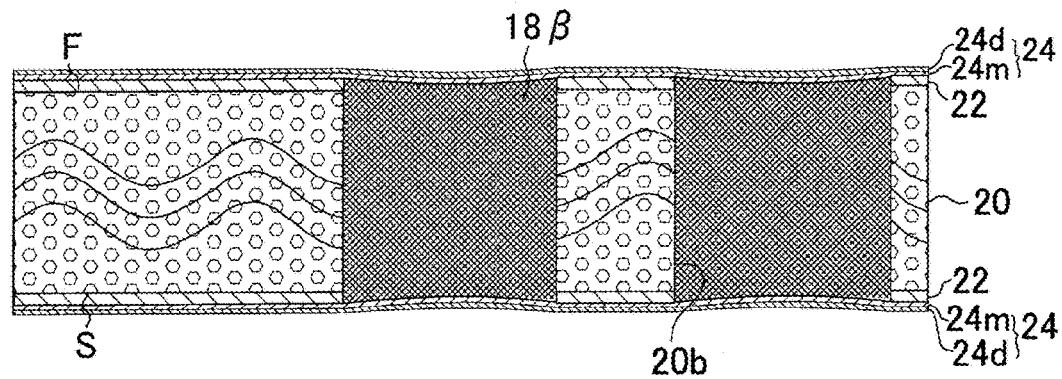

The first electroless plating film (24m) is formed by an electroless plating treatment on the surface of the insulating base material 20 and on the upper surface (18U) of the temporarily cured magnetic resin (18β) exposed from the openings (20b) (FIG. 3A). The first electrolytic plating film (24d) is formed by an electrolytic plating treatment on the first electroless plating film (24m) (FIG. 3B). The first electroless plating film (24m) and the first electrolytic plating film (24d) form a shield layer 24.

Figure 3C:
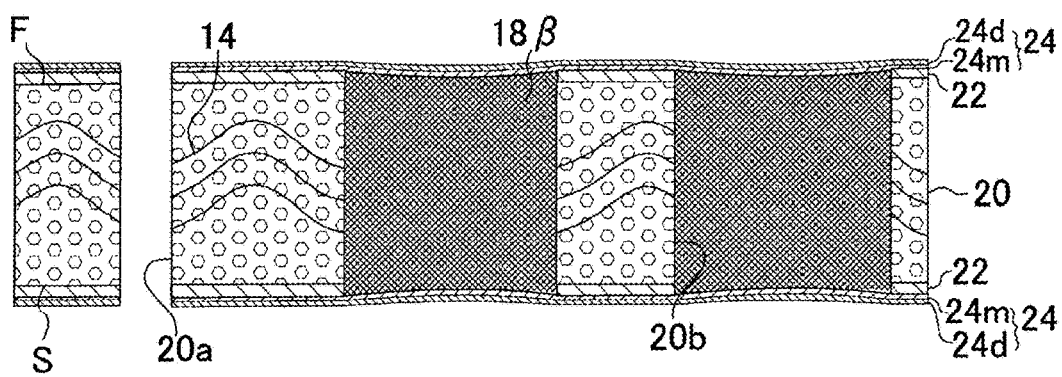

The first through holes (20a) are formed in the insulating base material 20 by mechanical drilling or laser processing (FIG. 3C). Thereafter, the first through holes (20a) are subjected to a desmear treatment using a chemical solution. During the desmear treatment, the temporarily cured magnetic resin (18β) covered by a shield layer 24 formed by the first electroless plating film (24m) and the first electrolytic plating film (24d) is not affected by the chemical solution. The iron oxide filler on the surface of the temporarily cured magnetic resin (18β) is not affected by the desmear treatment.

Figure 3D:
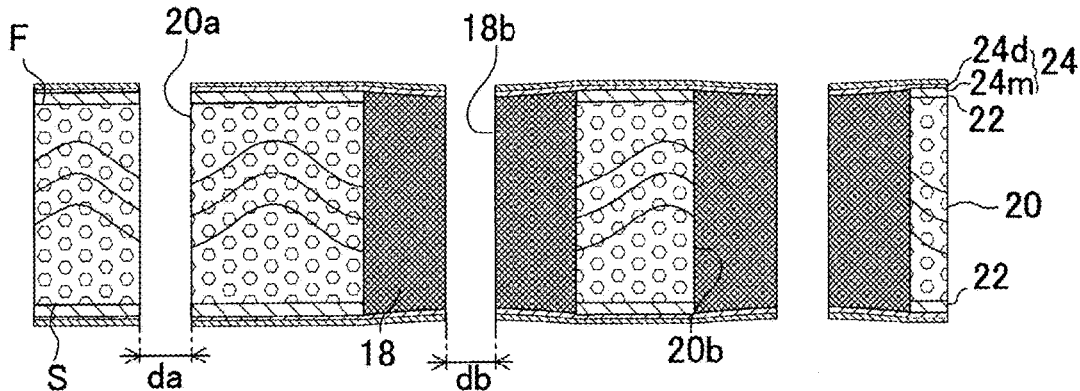
Figure 4A:
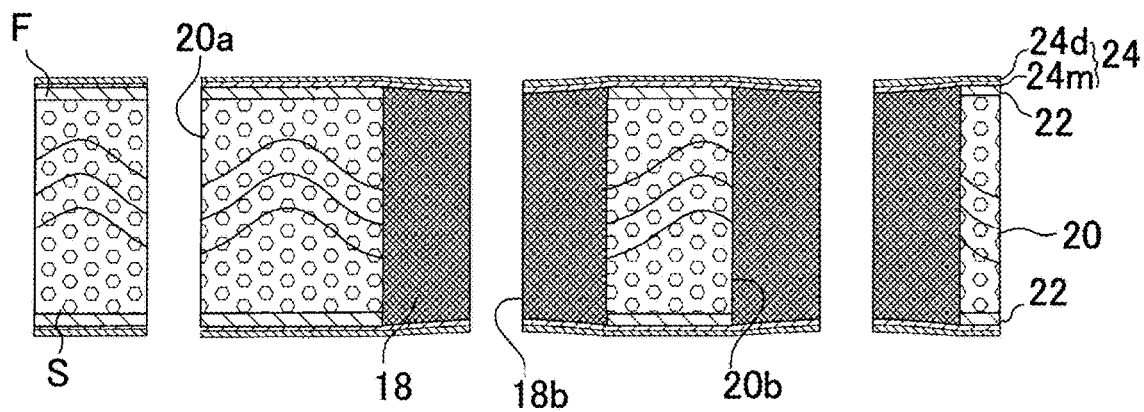
FIGS. 4A-4C are process diagrams illustrating the method for manufacturing an inductor built-in substrate according to the embodiment.

The second through holes (18b) are formed in the temporarily cured magnetic resin (18β) by mechanical drilling or laser processing. In this embodiment, since the iron oxide filler is contained in an amount of 60-90% by weight, through hole formation after fully curing is not easy. However, since the through holes are formed before fully curing, the through holes can be easily formed. The magnetic material layer of the temporarily cured magnetic substrate in a temporarily cured state is heated to cause the resin contained therein to crosslink, and thereby, the magnetic material layer is frilly cured and the magnetic resin 18 is formed (FIG. 3D). Here, heating is performed at 150° C.-190° C. for one hour. By high-pressure water washing, processing smear occurred during through hole formation is removed (FIG. 4A). Desmearing is performed using an alkaline agent. However, there is a risk that an alkaline agent may cause the iron oxide filler contained in the magnetic resin 18 to fall off during a process in which the resin is swelled and peeled off Therefore, here, high-pressure water washing is performed.

Figure 4B:
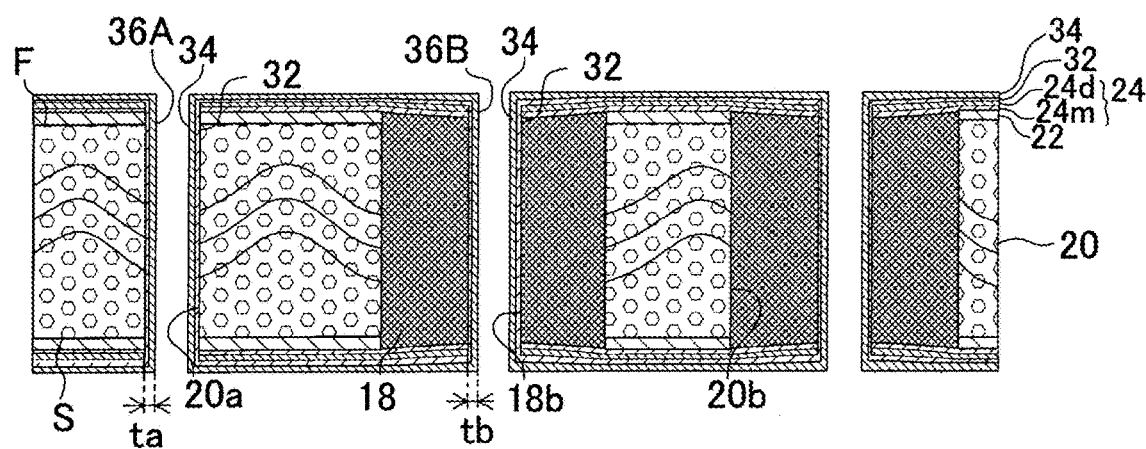

On the first electrolytic plating film (24d) on the surfaces of the insulating base material 20 and the magnetic resin 18 and on surfaces of the first through holes (20a) and the second through holes (18b), a second electroless plating film 32 is formed by an electroless plating treatment and a second electrolytic plating film 34 is formed by an electrolytic plating treatment. By the second electroless plating film 32 and the second electrolytic plating film 34, the first through-hole conductors (36A) are formed in the first through holes (20a) and the second through-hole conductors (36B) are formed in the second through holes (18b) (FIG. 4B).

Figure 4C:
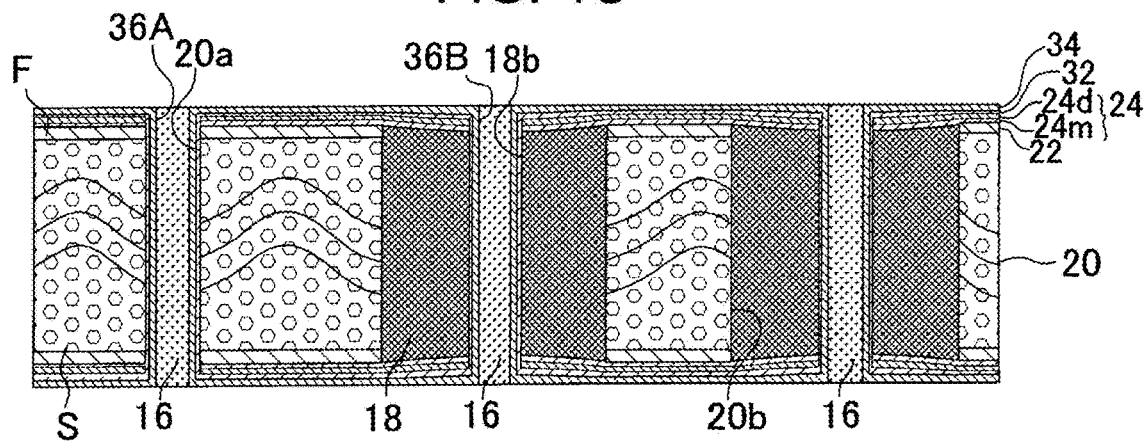
Figure 5A:
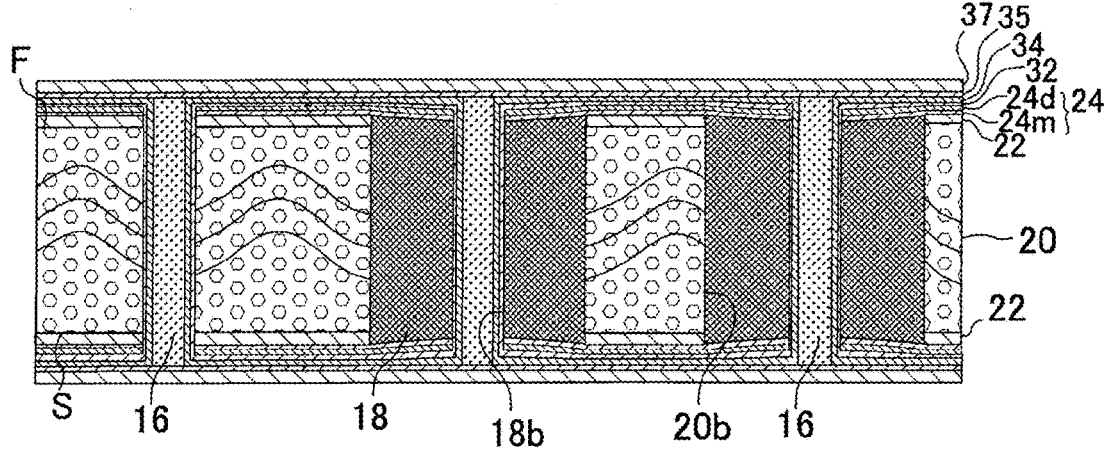
FIGS. 5A-5C are process diagrams illustrating the method for manufacturing an inductor built-in substrate according to the embodiment.
Figure 5B:
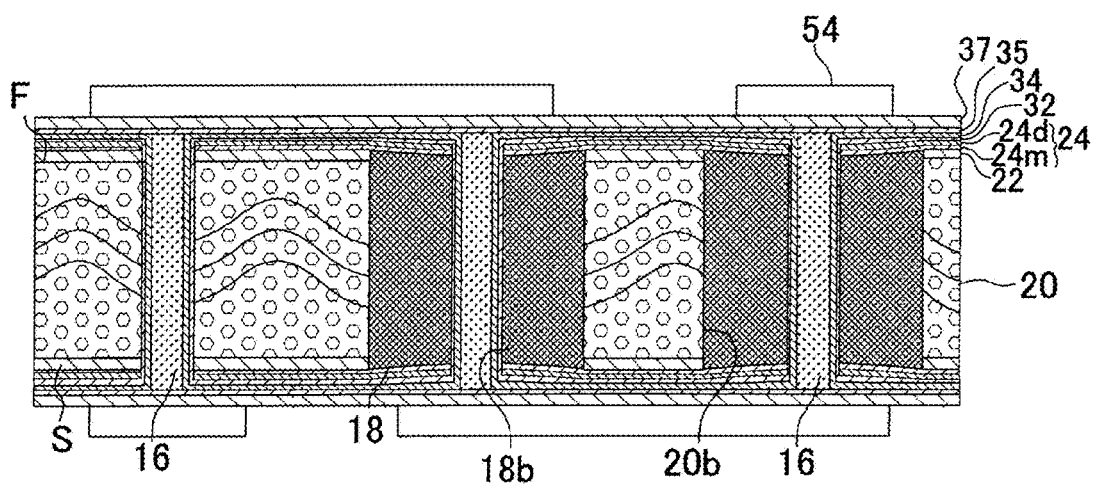

The resin filler 16 is filled inside the first through-hole conductors (36A) formed in the first through holes (20a) and inside the second through-hole conductors (36B) formed in the second through holes (18b), and the surface of the insulating base material 20 is polished (FIG. 4C). A third electroless plating film 35 is formed by electroless plating on the second electrolytic plating film 34 and on exposed surfaces of the resin filler 16, and a third electrolytic plating film 37 is formed on the third electroless plating film 35 (FIG. 5A). An etching resist 54 of a predetermined pattern is formed on the third electrolytic plating film 37 (FIG. SB).

Figure 5C:
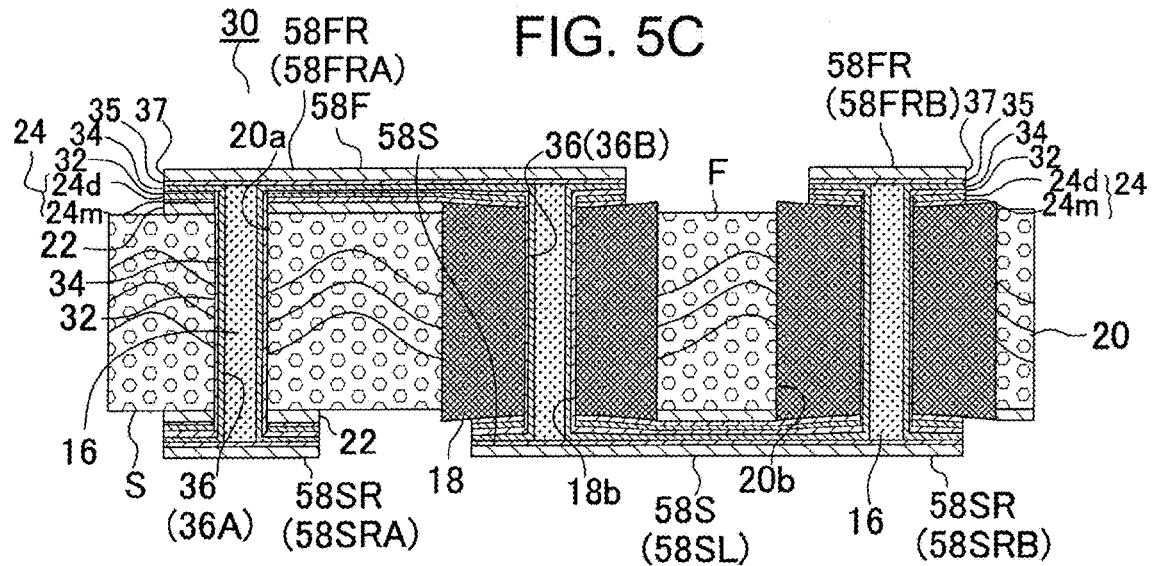

The third electrolytic plating film 37, the third electroless plating film 35, the second electrolytic plating film 34, the second electroless plating film 32, the first electrolytic plating film (24d), the first electroless plating film (24m), and the copper foil 22 exposed from the etching resist 54 are removed, and thereafter, the etching resist is removed, and the first conductor layer (58F), the second conductor layer (58S) are formed and the core substrate 30 is completed (FIG. 5C). The first conductor layer (58F) and the second conductor layer (58S) on the insulating base material 20 and the first through-hole lands (58FRA) on the first surface side of the first through-hole conductors (36A) and first through-hole lands (58SRA) on the second surface side of the first through-hole conductors (36A) are each formed of the copper foil 22 as a lowermost layer, the first electroless plating film (24m) on the copper foil 22, the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35. The first conductor layer (58F) and the second conductor layer (58S) on the magnetic resin 18 and the second through-hole lands (58FRB) on the first surface side of the second through-hole conductors (36B) and second through-hole lands (58SRB) on the second surface side of the second through-hole conductors (36B) are each formed of the first electroless plating film (24m), the first electrolytic plating film (24d) on the first electroless plating film (24m), the second electroless plating film 32 on the first electrolytic plating film (24d), the second electrolytic plating film 34 on the second electroless plating film 32, the third electroless plating film 35 on the second electrolytic plating film 34, and the third electrolytic plating film 37 on the third electroless plating film 35.

The upper side build-up layer (450F), the lower side build-up layer (450S), the solder resist layers (470F, 470S), and the solder bumps (476F, 476S) are formed on the core substrate 30 using known manufacturing methods (FIG. 1A).

REFERENCE EXAMPLE

Figure 6A:
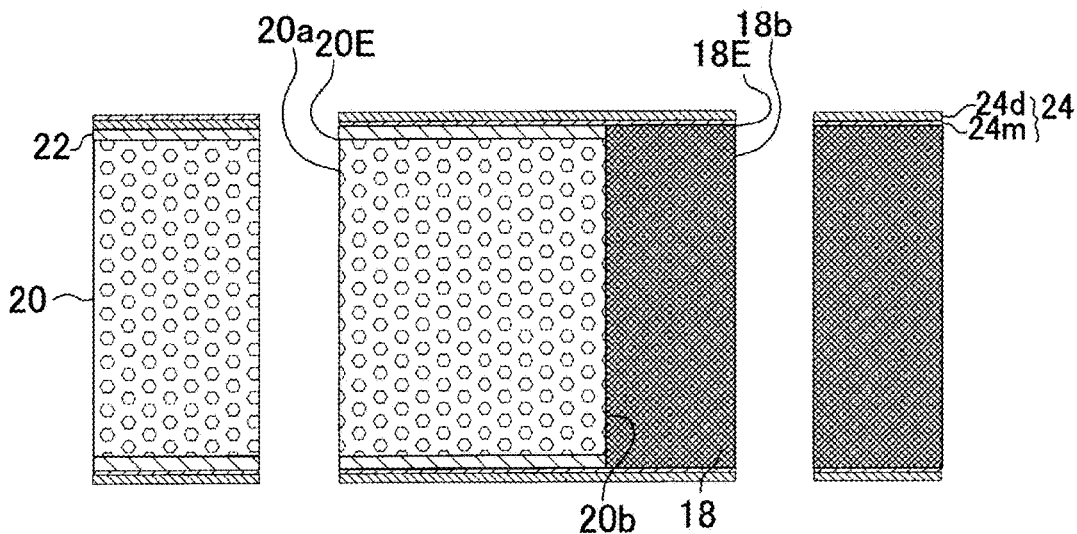
FIGS. 6A-6C are process diagrams illustrating a method for manufacturing an inductor built-in substrate according to a reference example.
Figure 6B:
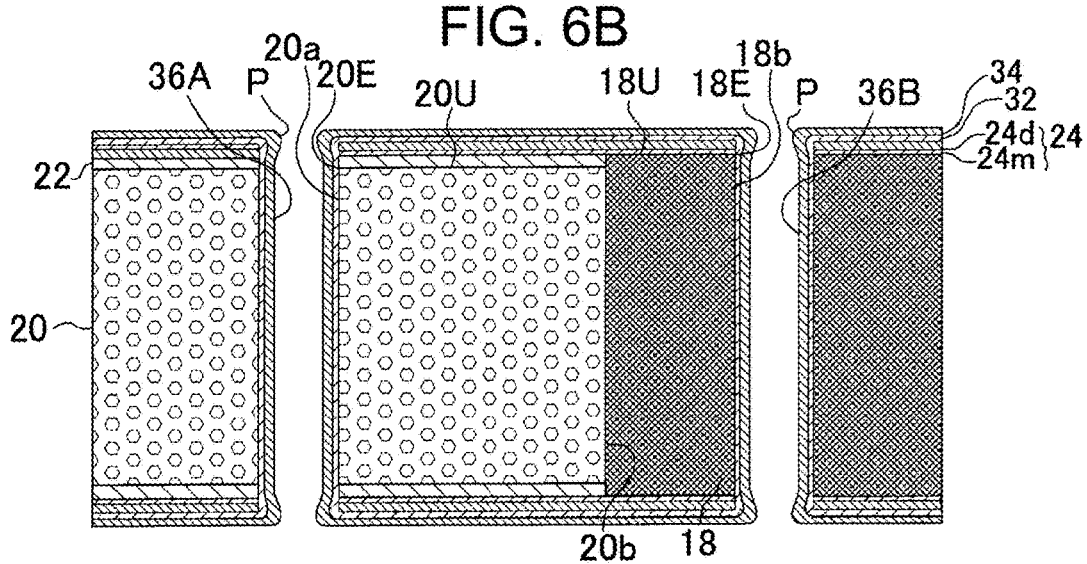
Figure 6C:
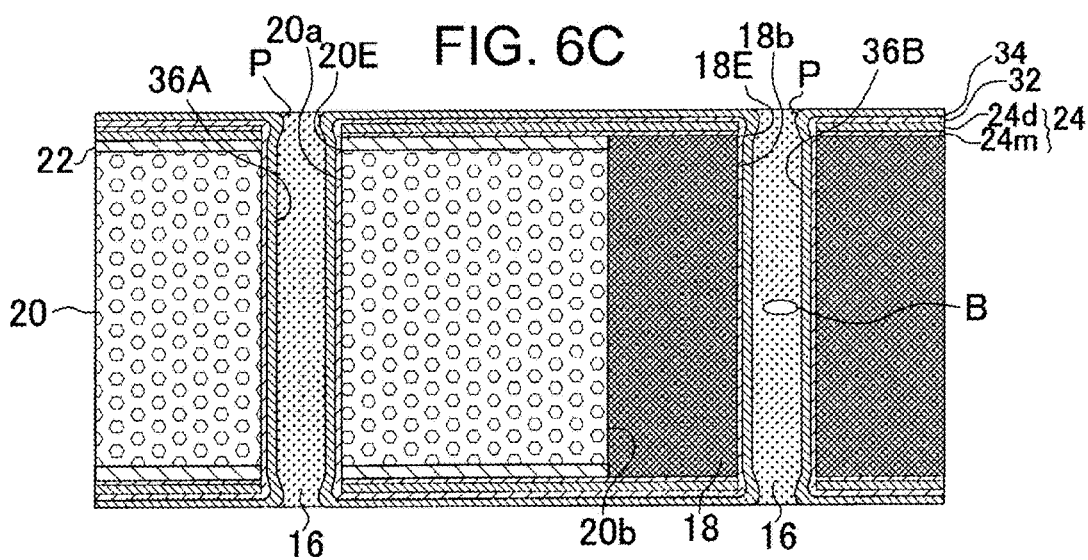

FIGS. 6A-6C illustrate a method for manufacturing an inductor built-in substrate of a reference example.

As illustrated in FIG. 6A, an angle part (20E) of an opening of a first through hole (20a) formed in an insulating base material 20 is formed to have a right angle. Residues in the first through hole (20a) are removed by a desmear treatment. An angle part (18E) of a second through hole (18b) formed in a magnetic resin 18 is formed to have a right angle. A chemical treatment is not performed and residues remain in the second through hole (18b). In the first through hole (20a), in the second through hole (18b), on an upper surface (20U) of the insulating base material 20, and on an upper surface (18U) of the magnetic resin 18, a second electroless plating film 32 and a second electrolytic plating film 34 are provided, and a first through-hole conductor (36A) is formed in the first through hole (20a), and a second through-hole conductor (36B) is formed in the second through hole (18b) (FIG. 6B). In this case, since the angle of the angle part (20E) of the first through hole (20a) is a right angle, an inflow amount of a plating solution is reduced, and a protruding part (P) protruding toward an inner side of the first through hole (20a) is likely to be formed at an upper end and at a lower end of the first through-hole conductor (36A) formed in the first through hole (20a). Similarly, since the angle of the angle part (18E) of the second through hole (18b) is a right angle, a protruding part (P) protruding toward an inner side of the second through hole (18b) is likely to be formed at an upper end and at a lower end of the second through-hole conductor (36B). Then, in order to avoid non-filling due to an effect of the protruding parts (P), a resin filler 16 is filled under a high pressure in the first through-hole conductor (36A) and the second through-hole conductor (36B) (FIG. 6C). In this case, due to an effect of the resin residues in the second through-hole conductor (36B), a void (B) is likely to be generated in the resin filler 16. In the inductor built-in substrate of the reference example, due to an effect of the void, reliability of the second through-hole conductor (36B) is low.

In Japanese Patent Application Laid-Open Publication No. 2016-197624, a magnetic material is accommodated in a resin layer, through-hole conductors are provided in the resin layer, and the through-hole conductors are prevented from being in contact with the magnetic material.

In Japanese Patent Application Laid-Open Publication No. 2016-197624, since the through-hole conductors are formed in the resin layer, it is thought that a ratio of the magnetic material with respect to a size of the inductor component is low and it is difficult to increase an inductance.

An inductor built-in substrate according to an embodiment of the present invention is small in size and has a large inductance.

An inductor built-in substrate according to an embodiment of the present invention includes: a core substrate in which openings and first through holes are formed; a magnetic resin filled in the openings and having second through holes; first through-hole conductors formed of metal films formed in the first through holes; and second through-hole conductors formed of metal films formed in the second through holes. An angle of an angle part of the second through hole is an obtuse angle, the angle part being formed by an upper surface of the magnetic resin and a side wall of the second through hole.

In an inductor built-in substrate according to an embodiment of the present invention, the second through-hole conductor formed of a metal film is directly formed in the second through hole of the magnetic resin. Therefore, a volume of the magnetic resin of an inductor component can be increased, and an inductance can be increased. The angle of the angle part of the second through hole is an obtuse angle, the angle part being formed by the upper surface of the magnetic resin and the side wall of the second through hole. Therefore, a stress applied from the angle part to a conductor layer provided at the angle part is relaxed. A crack is unlikely to occur in the conductor layer at the angle part, and reliability of the inductor built-in substrate is high.

Obviously, numerous modifications and variations of the present invention are possible in light of the above teachings. It is therefore to be understood that within the scope of the appended claims, the invention may be practiced otherwise than as specifically described herein.

What is claimed is:

1. An inductor built-in substrate, comprising:
   a core substrate having a plurality of openings;
   a magnetic resin filled in the openings and having a plurality of through holes; and
   a plurality of through-hole conductors formed in the plurality of through holes respectively such that each of the through-hole conductors comprises a metal film,
   wherein the magnetic resin is formed such that each of the through holes has an angle part having an obtuse angle formed by an upper surface of the magnetic resin and a side wall of a respective one of the through holes.

2. The inductor built-in substrate according to claim 1, wherein the magnetic resin includes an iron oxide filler in an amount of 60% by weight or more.

3. The inductor built-in substrate according to claim 1, wherein the plurality of through-hole conductors is formed such that a resin filler is filling inside each of the through-hole conductors.

4. The inductor built-in substrate according to claim 1, further comprising:
   a plurality of through-hole lands formed on the magnetic resin and connected to the plurality of through-hole conductors respectively such that each of the through-hole lands has a diameter that is smaller than a diameter of a respective one of the openings in which the magnetic resin is filled.

5. The inductor built-in substrate according to claim 1, further comprising:
   a plurality of through-hole lands formed on the magnetic resin and connected to the plurality of through-hole conductors respectively such that each of the through-hole lands includes a lowermost layer comprising a plating film.

6. The inductor built-in substrate according to claim 5, wherein the plurality of through-hole lands is formed such that each of the through-hole lands includes the metal film extending from a respective one of the through-hole conductors, and a shield layer formed on a magnetic resin side of the metal film.

7. The inductor built-in substrate according to claim 6, wherein the plurality of through-hole lands is formed such that the shield layer in each of the through-hole lands includes an electroless plating film and an electrolytic plating film.

8. The inductor built-in substrate according to claim 1, wherein the plurality of through-hole conductors is formed such that the metal film in each of the through-hole conductors includes an electroless plating film and an electrolytic plating film.

9. The inductor built-in substrate according to claim 2, wherein the plurality of through-hole conductors is formed such that a resin filler is filling inside each of the through-hole conductors.

10. The inductor built-in substrate according to claim 2, further comprising:
    a plurality of through-hole lands formed on the magnetic resin and connected to the plurality of through-hole conductors respectively such that each of the through-hole lands has a diameter that is smaller than a diameter of a respective one of the openings in which the magnetic resin is filled.

11. The inductor built-in substrate according to claim 2, further comprising:
    a plurality of through-hole lands formed on the magnetic resin and connected to the plurality of through-hole conductors respectively such that each of the through-hole lands includes a lowermost layer comprising a plating film.

12. The inductor built-in substrate according to claim 11, wherein the plurality of through-hole lands is formed such that each of the through-hole lands includes the metal film extending from a respective one of the through-hole conductors, and a shield layer formed on a magnetic resin side of the metal film.

13. The inductor built-in substrate according to claim 1, further comprising:
    a plurality of first through-hole conductors formed in the core substrate,
    wherein the core substrate has a plurality of first through holes in which the plurality of first through-hole conductors is formed respectively such that each of the first through-hole conductors comprises a metal film, and the plurality of through holes formed in the magnetic resin is a plurality of second through holes such that the plurality of through-hole conductors formed in the magnetic resin is a plurality of second through holes formed in the plurality of second through holes respectively.

14. The inductor built-in substrate according to claim 13, further comprising:
    a plurality of first through-hole lands formed on the core substrate and connected to the plurality of first through-hole conductors respectively such that each of the first through-hole lands includes a lowermost layer comprising a metal foil; and
    a plurality of second through-hole lands formed on the magnetic resin and connected to the plurality of second through-hole conductors respectively such that each of the second through-hole lands includes a lowermost layer comprising a plating film.

15. The inductor built-in substrate according to claim 14, wherein the plurality of first through-hole lands is formed such that each of the first through-hole lands includes the metal film extending from a respective one of the first through-hole conductors, and a shield layer formed on a core substrate side of the metal film, and the plurality of second through-hole lands is formed such that each of the second through-hole lands includes the metal film extending from a respective one of the second through-hole conductors, and a shield layer formed on a magnetic resin side of the metal film.

16. The inductor built-in substrate according to claim 15, wherein the plurality of first through-hole lands is formed such that the shield layer in each of the first through-hole lands includes an electroless plating film and an electrolytic plating film, and the plurality of second through-hole lands is formed such that the shield layer in each of the second through-hole lands includes an electroless plating film and an electrolytic plating film.

17. The inductor built-in substrate according to claim 13, wherein the plurality of first through-hole conductors is formed such that the metal film in each of the first through-hole conductors includes an electroless plating film and an electrolytic plating film, and the plurality of second through-hole conductors is formed such that the metal film in each of the second through-hole conductors includes an electroless plating film and an electrolytic plating film.

18. The inductor built-in substrate according to claim 13, wherein the plurality of first through-hole conductors and the plurality of second through-hole conductors are formed such that the metal film in each of the first through-hole conductors has a thickness that is greater than a thickness of the metal film in each of the second through-hole conductors.

19. The inductor built-in substrate according to claim 13, wherein the plurality of first through holes and the plurality of second through holes are formed such that a diameter of each of the first through holes is substantially equal to a diameter of each of the second through holes.

20. A method for manufacturing an inductor built-in substrate, comprising:
    preparing a core substrate comprising a resin substrate and a metal foil laminated on the resin substrate;
    forming a plurality of openings in the core substrate;
    filling a magnetic resin in the plurality of openings formed in the core substrate;
    forming a plurality of through holes in the magnetic resin; and
    forming a plating film on the core substrate, on a surface of the magnetic resin, and in the through holes such that a plurality of through-hole conductors is formed in the plurality of through holes respectively and that each of the through-hole conductors comprises a metal film,
    wherein the filling of the magnetic resin includes polishing an upper surface of the magnetic resin in each of the openings such that a central portion of the upper surface of the magnetic resin in each of the openings is recessed relative to a peripheral portion of the upper surface of the magnetic resin in each of the openings, and the plurality of through holes is formed in the magnetic resin such that each of the through holes has an angle part having an obtuse angle formed by the upper surface of the magnetic resin and a side wall of a respective one of the through holes.

* * * * *